United States Patent
Zhu et al.

(10) Patent No.: US 7,732,288 B2
(45) Date of Patent: Jun. 8, 2010

(54) METHOD FOR FABRICATING A SEMICONDUCTOR STRUCTURE

(75) Inventors: Huilong Zhu, Poughkeepsie, NY (US); Lawrence A. Clevenger, LaGrangeville, NY (US); Omer H. Dokumaci, Wappingers Falls, NY (US); Oleg Gluschenkov, Poughkeepsie, NY (US); Kaushik A. Kumar, Beacon, NY (US); Carl J. Radens, LaGrangeville, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/367,764

(22) Filed: Feb. 9, 2009

(65) Prior Publication Data

US 2009/0142894 A1    Jun. 4, 2009

Related U.S. Application Data

(62) Division of application No. 10/904,660, filed on Nov. 22, 2004, now abandoned.

(51) Int. Cl.
*H01L 29/76* (2006.01)
*H01L 31/062* (2006.01)

(52) U.S. Cl. ............ 438/298; 438/149; 438/300; 257/347; 257/377

(58) Field of Classification Search ........... 438/149, 438/298, 300, 701, 713, 739; 257/347, 377, 257/E21.409, E21.385, E21.438
See application file for complete search history.

(56) References Cited

U.S. PATENT DOCUMENTS

| | | | |
|---|---|---|---|
| 5,994,747 A * | 11/1999 | Wu | 257/408 |
| 6,010,936 A | 1/2000 | Son | |
| 6,214,679 B1 | 4/2001 | Murthy et al. | |
| 6,414,353 B2 | 7/2002 | Maeda et al. | |
| 6,437,404 B1 | 8/2002 | Xiang et al. | |
| 6,465,313 B1 | 10/2002 | Yu et al. | |
| 6,787,852 B1 * | 9/2004 | Yu et al. | 257/347 |
| 6,927,110 B2 | 8/2005 | Kanemoto | |
| 7,566,624 B2 * | 7/2009 | Leitner et al. | 438/299 |
| 2003/0025135 A1 | 2/2003 | Matsumoto et al. | |

* cited by examiner

*Primary Examiner*—Theresa T Doan
(74) *Attorney, Agent, or Firm*—Schmeiser, Olsen & Watts; Steven Capella

(57) ABSTRACT

A method for fabricating a semiconductor structure. The novel transistor structure comprises first and second source/drain (S/D) regions whose top surfaces are lower than a top surface of the channel region of the transistor structure. A semiconductor layer and a gate stack on the semiconductor layer are provided. The semiconductor layer includes (i) a channel region directly beneath the gate stack, and (ii) first and second semiconductor regions essentially not covered by the gate stack, and wherein the channel region is disposed between the first and second semiconductor regions. The first and second semiconductor regions are removed. Regions directly beneath the removed first and second semiconductor regions are removed so as to form first and second source/drain regions, respectively, such that top surfaces of the first and second source/drain regions are below a top surface of the channel region.

16 Claims, 11 Drawing Sheets

METHOD FOR FABRICATING A SEMICONDUCTOR STRUCTURE

This application is a divisional application claiming priority to Ser. No. 10/904,660, filed Nov. 22, 2004.

BACKGROUND OF THE INVENTION

1. Technical Field

The present invention relates to semiconductor transistors, and more particularly, to lowered source/drain semiconductor transistors.

2. Related Art

A typical semiconductor transistor comprises a channel region and first and second source/drain (S/D) regions formed in a semiconductor layer, wherein the channel region is disposed between the first and second S/D regions. The typical semiconductor transistor further comprises a gate stack (that includes a gate dielectric region directly on top the channel region and a gate region on top of the gate dielectric region) directly above the channel region. In addition, first and second gate spacers are formed on sidewalls of the gate stack so as to define the first and second S/D regions, respectively. The capacitance between the gate region and the first S/D region has several components one of which is defined by a path from the gate region to the first S/D region through the first gate spacer. This capacitance component is usually referred to as the out-fringing capacitance. For example, the out-fringing capacitance between the gate region and the second S/D region is defined by a path from the gate region to the second S/D region through the second gate spacer.

It is desirable to minimize the out-fringing capacitances between the gate region and the first and second S/D regions in order to increase transistor performance or to reduce transistor switching time. Therefore, there is a need for a novel transistor structure in which the out-fringing capacitances between the gate region and the first and second S/D regions are relatively less than those of the prior art. There is also a need for a method for fabricating the novel transistor structure.

SUMMARY OF THE INVENTION

The present invention provides a semiconductor structure, comprising (a) a semiconductor layer including a channel region and first and second source/drain regions, wherein the channel region is disposed between the first and second source/drain regions, and wherein top surfaces of the first and second source/drain regions are below a top surface of the channel region; (b) a gate dielectric region on the channel region; and (c) a gate region on the gate dielectric region, wherein the gate region is electrically isolated from the channel region by the gate dielectric region.

The present invention also provides a method for fabricating a semiconductor structure, the method comprising the steps of (a) providing a semiconductor layer and a gate stack on the semiconductor layer, wherein the semiconductor layer comprises (i) a channel region directly beneath the gate stack and (ii) first and second semiconductor regions essentially not covered by the gate stack, and wherein the channel region is disposed between the first and second semiconductor regions; (b) removing the first and second semiconductor regions; and (c) doping regions directly beneath the removed first and second semiconductor regions so as to form first and second source/drain regions, respectively, such that top surfaces of the first and second source/drain regions are below a top surface of the channel region.

The present invention also provides a method for fabricating a semiconductor structure, the method comprising the steps of (a) providing (i) an underlying dielectric layer, (ii) a semiconductor layer on the underlying dielectric layer, and (iii) a gate stack on the semiconductor layer; (b) implanting first dopants in a top layer of the underlying dielectric layer except in a separating dielectric region of the top layer directly beneath the gate stack; (c) removing the top layer of the underlying dielectric layer except the separating dielectric region; (d) epitaxially growing semiconductor regions to fill the removed top layer of the underlying dielectric layer; and (e) implanting second dopants in semiconductor regions of the semiconductor layer and the epitaxially grown semiconductor regions on opposing sides of the gate stack so as to form first and second source/drain regions such that the separating dielectric region is disposed between the first and second source/drain regions.

The present invention provides a novel transistor structure in which the out-fringing capacitances between the gate region and the first and second S/D regions are relatively less than those of the prior art. The present invention also provides a method for fabricating the novel transistor structure.

DETAILED DESCRIPTION OF THE INVENTION

Figure 1A:
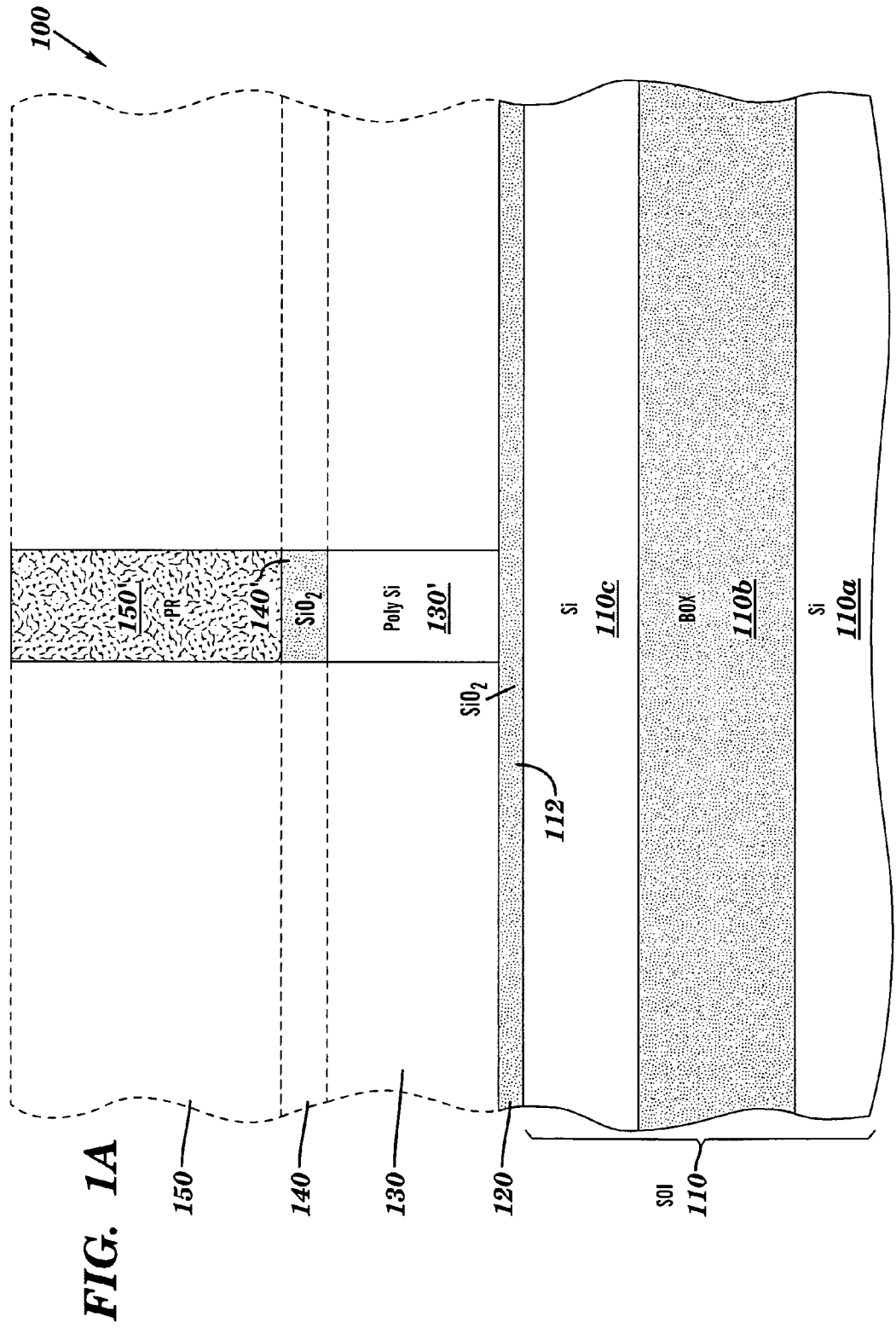
FIGS. 1A-1K show cross-section views of a semiconductor structure used to illustrate a method of fabricating semiconductor structures, in accordance with embodiments of the present invention.

FIGS. 1A-1K show cross-section views of a semiconductor structure 100 used to illustrate a method of fabricating semiconductor structures, in accordance with embodiments of the present invention. More specifically, with reference to FIG. 1A, in one embodiment, the method starts out with an SOI (silicon on insulator) substrate 110 comprising, illustratively, a silicon layer 110a, an underlying dielectric layer 110b (usually referred to as BOX, i.e., buried oxide layer) on top of the silicon layer 110a, and another silicon layer 110c on top of the underlying dielectric layer 110b. Starting from FIG. 1B, the silicon layer 110a is omitted for simplicity.

Next, in one embodiment, the method comprises the step of forming a gate dielectric layer 120 on top of the silicon layer 110c. In one embodiment, the gate dielectric layer 120 can comprise silicon dioxide and can be formed by thermally oxidizing a top surface 112 of the silicon layer 110c.

Next, in one embodiment, a gate layer 130 is formed on top of the gate dielectric layer 120. In one embodiment, the gate layer 130 can comprise poly-silicon. Next, in one embodiment, a hard mask dielectric layer 140 is formed on top of the poly-silicon layer 130. In one embodiment, hard mask dielectric layer 140 can comprise silicon dioxide and can be formed by, illustratively, chemical vapor deposition (i.e., CVD). Then, in one embodiment, a photoresist layer 150 is formed on top of the hard mask dielectric layer 140.

Next, in one embodiment, the photoresist layer 150 is patterned to become the patterned photoresist layer 150' by, illustratively, photolithography (i.e., the regions of the photoresist layer 150 represented by the dashed lines are removed).

Next, in one embodiment, the patterned photoresist layer 150' can be used as a mask to etch the hard mask dielectric layer 140 and then the gate layer 130 so as to form the hard mask dielectric region 140' and the gate region 130', respectively. In other words, the regions of the hard mask dielectric layer 140 and the gate layer 130 represented by the dashed lines are removed.

Figure 1B:
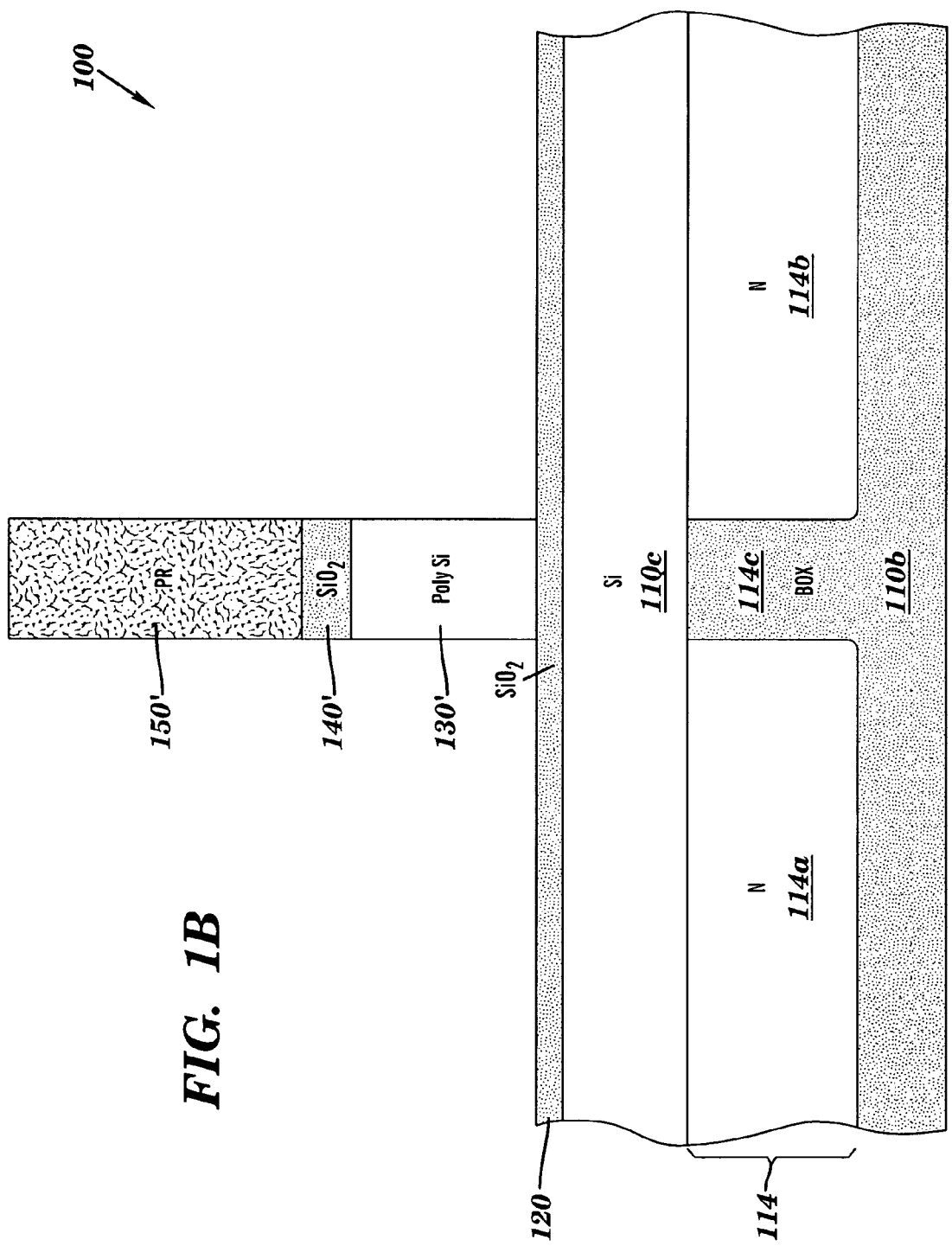

Next, with reference to FIG. 1B, in one embodiment, the method proceeds with an implantation step of using the regions 130', 140', and 150' as a mask to implant nitrogen in a top layer 114 of the underlying dielectric layer 110b. As a result, regions 114a and 114b of the top layer 114 are doped with nitrogen except for a separating dielectric region 114c directly beneath the regions 130', 140', and 150'. In general, any dopants can be used here instead of nitrogen provided that the doped regions 114a and 114b doped with the dopants can be later etched away (i.e., removed) essentially without affecting the other regions of the underlying dielectric layer 110b.

Figure 1C:
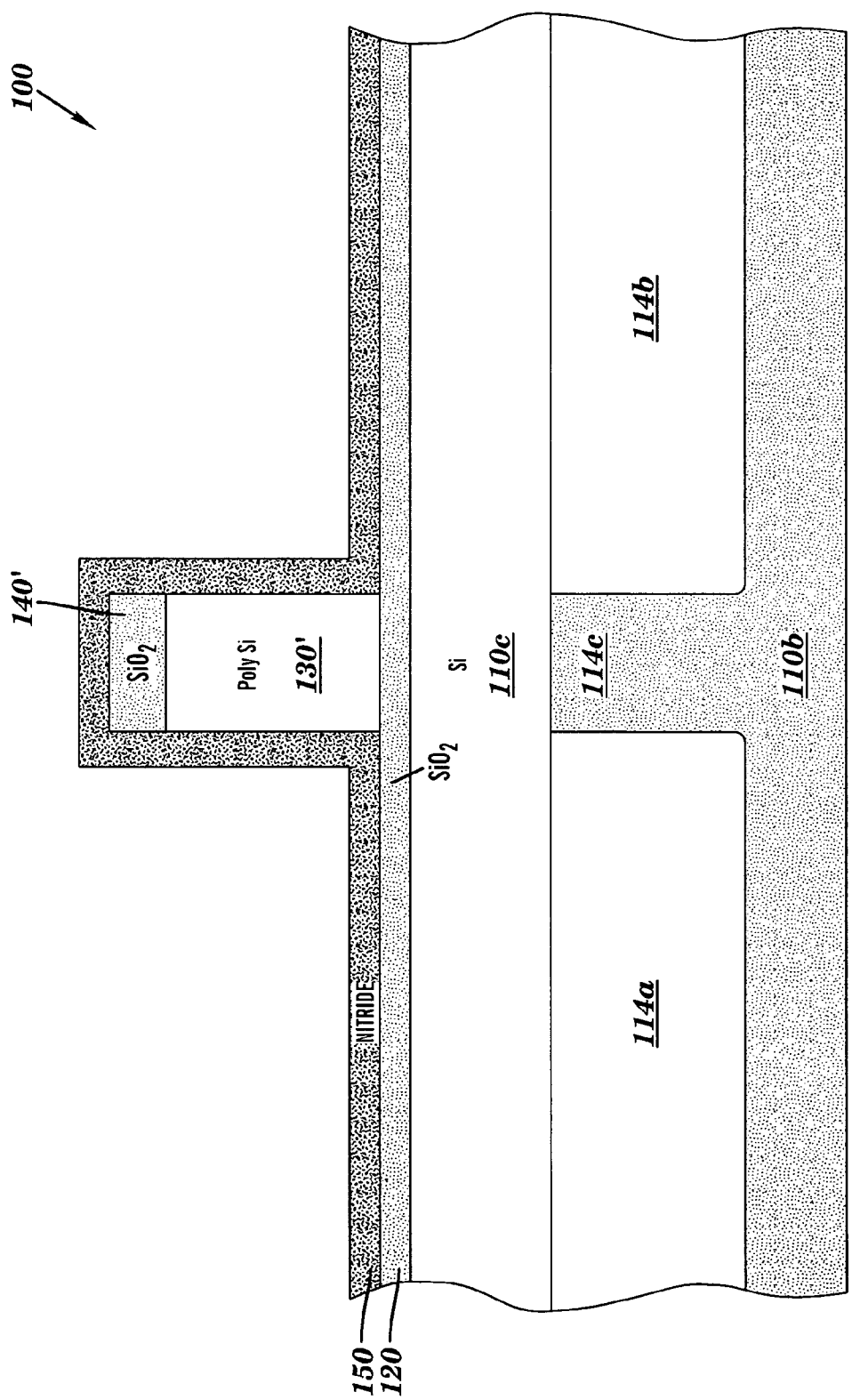

Next, with reference to FIG. 1C, in one embodiment, the patterned photoresist layer 150' (FIG. 1B) can be removed, and a nitride layer 150 can be blanket-deposited on top of the structure 100.

Figure 1D:
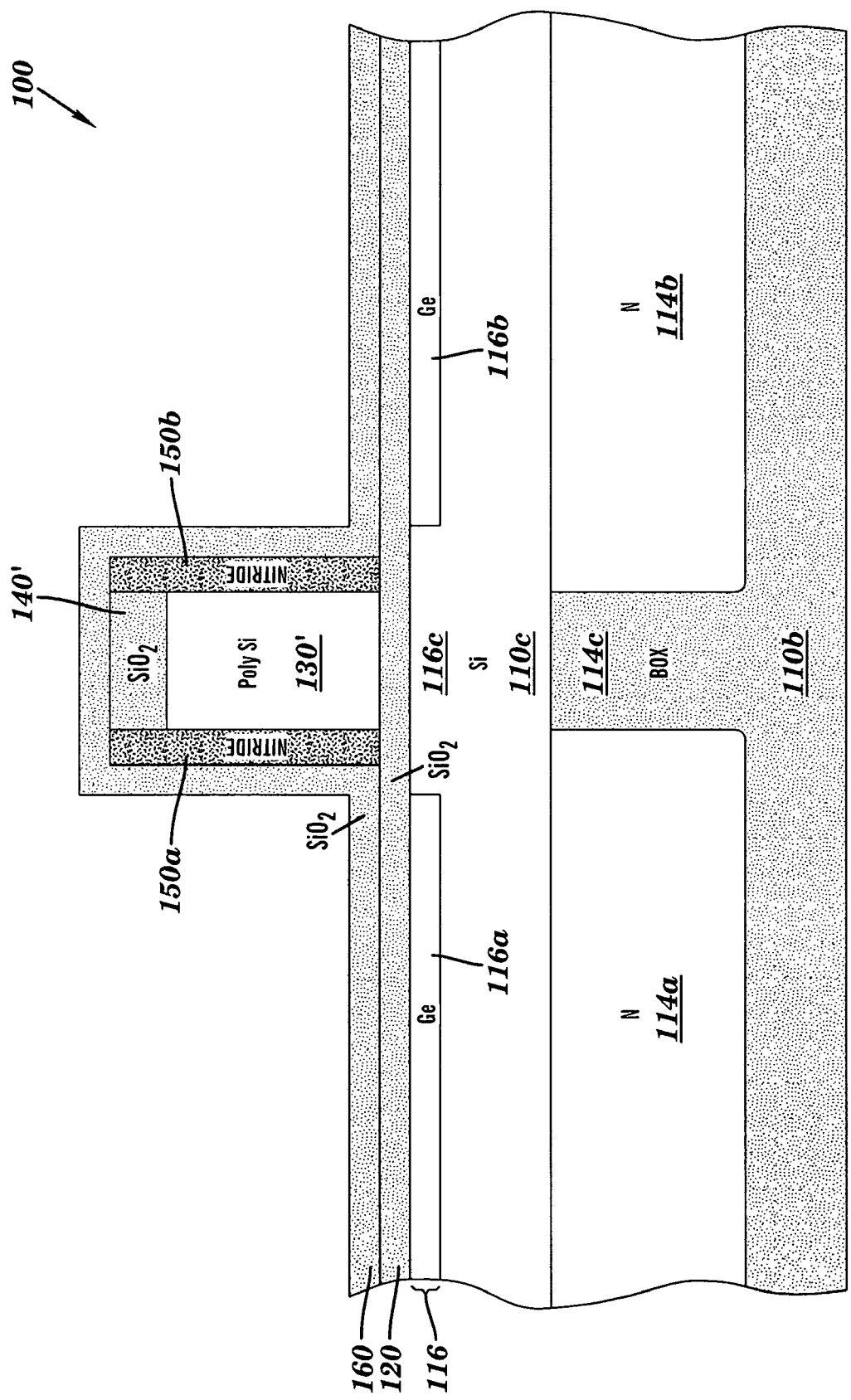

Next, with reference to FIG. 1D, in one embodiment, the method can proceed with an anisotropic etching step that removes most of the nitride layer 150 and leaves nitride spacers 150a and 150b on sidewalls of the gate stack 130',140' (that comprises the gate region 130' and the hard mask dielectric region 140'). In one embodiment, the anisotropic etching step can be RIE (Reactive Ion Etching). Next, in one embodiment, an oxide (e.g., $SiO_2$) layer 160 can be blanket-deposited on the structure 100 by, illustratively, CVD.

Next, in one embodiment, the gate stack 130',140' can be used as a mask to implant germanium in a top layer 116 of the silicon layer 110c. As a result, doped regions 116a and 116b of the top layer 116 are doped with germanium except for a region 116c directly beneath the gate stack 130',140'. In general, any dopants can be used here instead of germanium provided that the resulting silicon regions 116a and 116b doped with the dopants can be later etched away essentially without affecting the other regions of the silicon layer 110c.

Figure 1E:
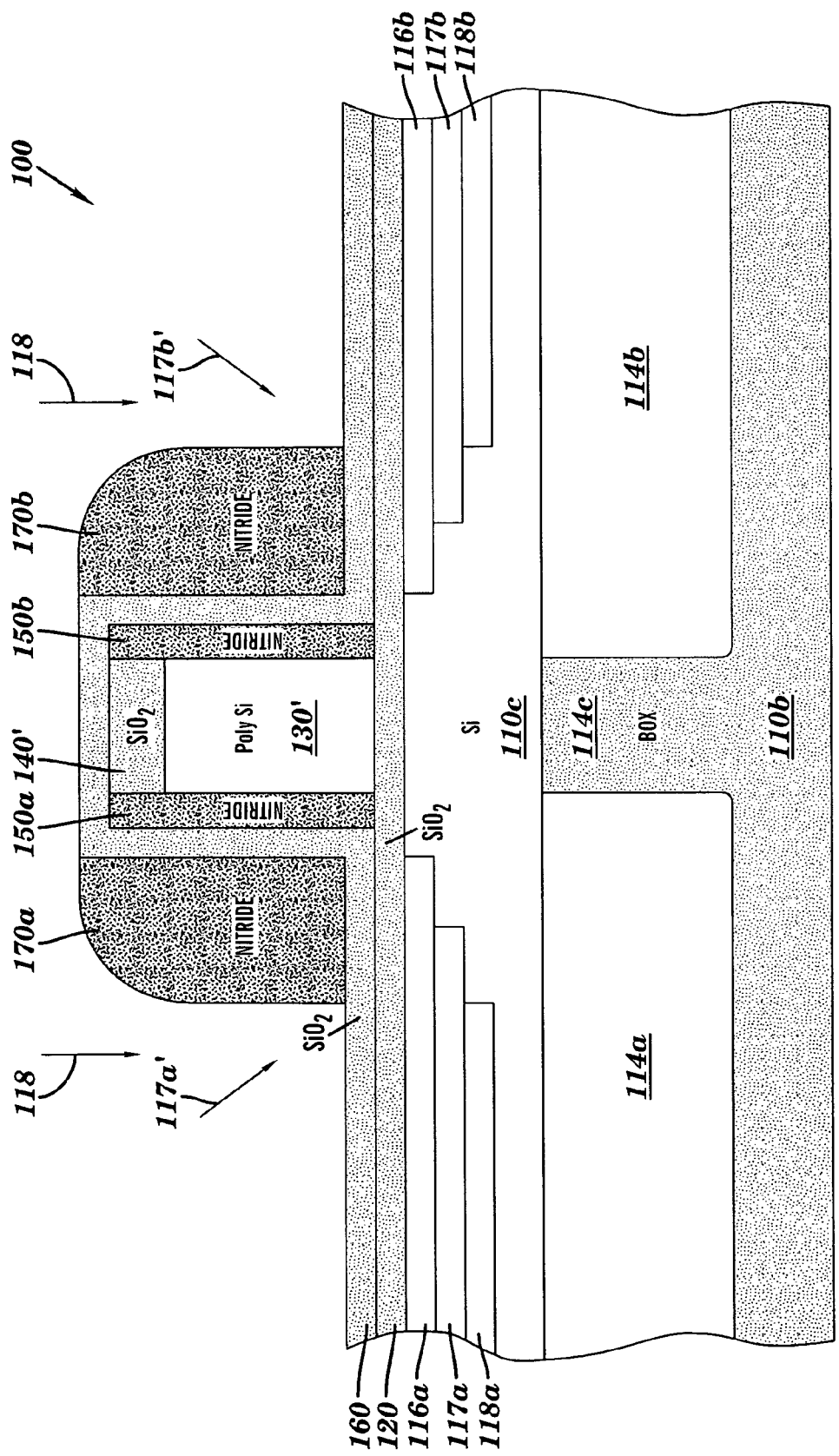

Next, with reference to FIG. 1E, in one embodiment, nitride spacers 170a and 170b can be formed on sidewalls of the gate stack 130',140' (that now includes a portion of the oxide layer 160 that covers the gate stack 130',140'). In one embodiment, the nitride spacers 170a and 170b can be formed by blanket-depositing a nitride layer (not shown) on top of the structure 100 and then etching back.

Next, in one embodiment, the method proceeds with an implantation step (represented by arrow 117a') of implanting germanium in the silicon layer 110c at an angle such that the resulting doped region 117a is deeper than the doped region 116a and extends under the nitride spacer 170a. Then, in one embodiment, the method proceeds with an implantation step (represented by arrow 117b') of implanting germanium in the silicon layer 110c at an angle such that the resulting doped region 117b is deeper than the doped region 116b and extends under the nitride spacer 170b. The arrows 117a' and 117b' also indicate the respective directions of germanium bombardments.

Next, in one embodiment, the method proceeds with an implantation step (represented by arrow 118) of implanting germanium vertically in the silicon layer 110c such that the resulting doped regions 118a and 118b are deeper than the doped regions 117a and 117b, respectively. The arrow 118 also indicates the direction of germanium bombardment. Starting from FIG. 1F, the doped regions 116a, 117a, and 118a are collectively referred to as the doped region 119a. Similarly, the doped regions 116b, 117b, and 118b are collectively referred to as the doped region 119b.

Figure 1F:
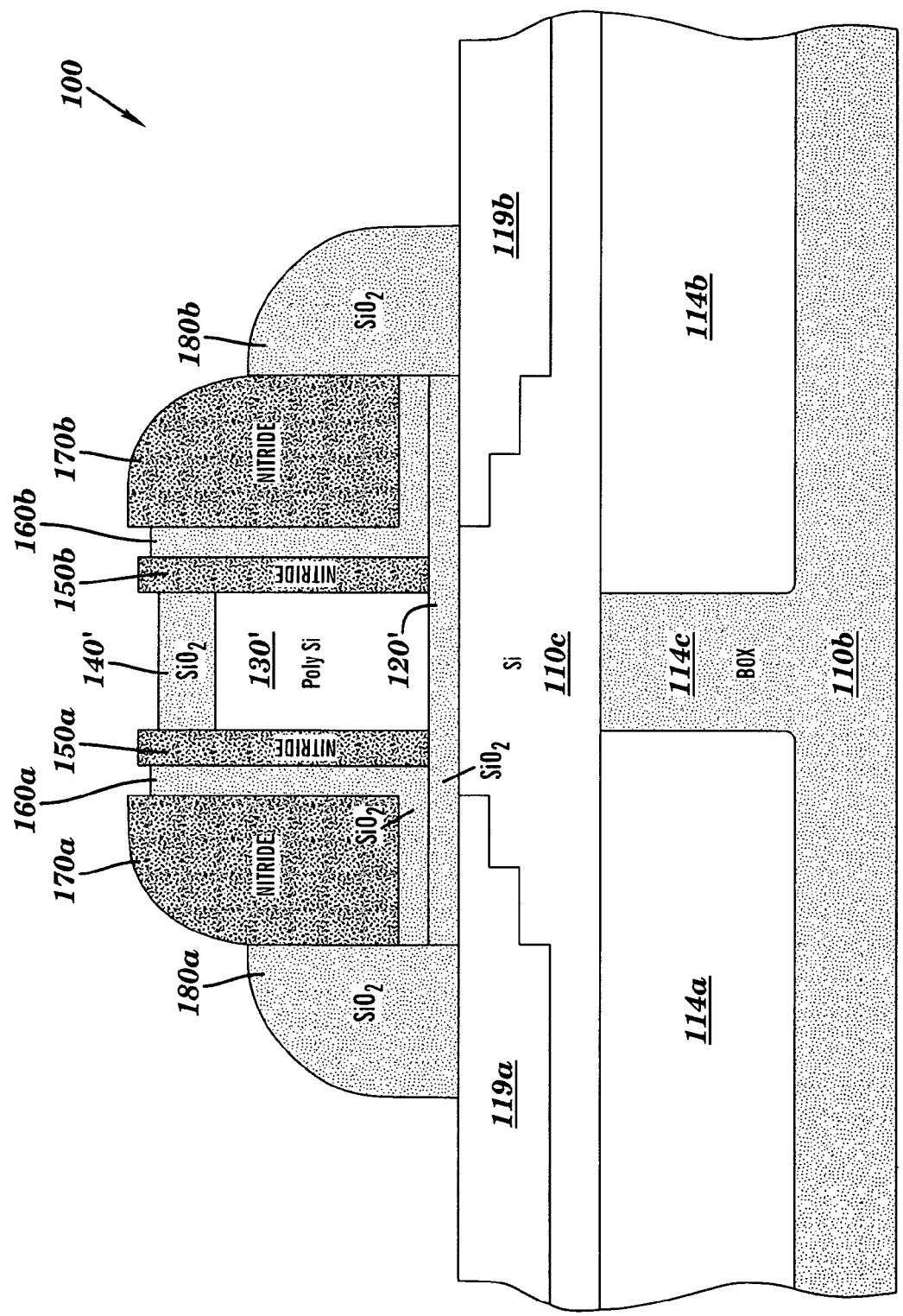

Next, with reference to FIG. 1F, in one embodiment, oxide spacers 180a and 180b are formed on sidewalls of the nitride spacers 170a and 170b, respectively. In one embodiment, the oxide spacers 180a and 180b can be formed by blanket-depositing an oxide layer (not shown) on top of the structure 100 and then etching back. As a result, a top region of the oxide layer 160 is etched away, and the nitride spacers 160a and 160b are exposed to the atmosphere. Also as a result, the doped regions 119a and 119b are exposed to the atmosphere. The oxide layer 160 is reduced to the oxide regions 160a and 160b. The gate dielectric layer 120 is reduced to gate dielectric region 120'.

Figure 1G:
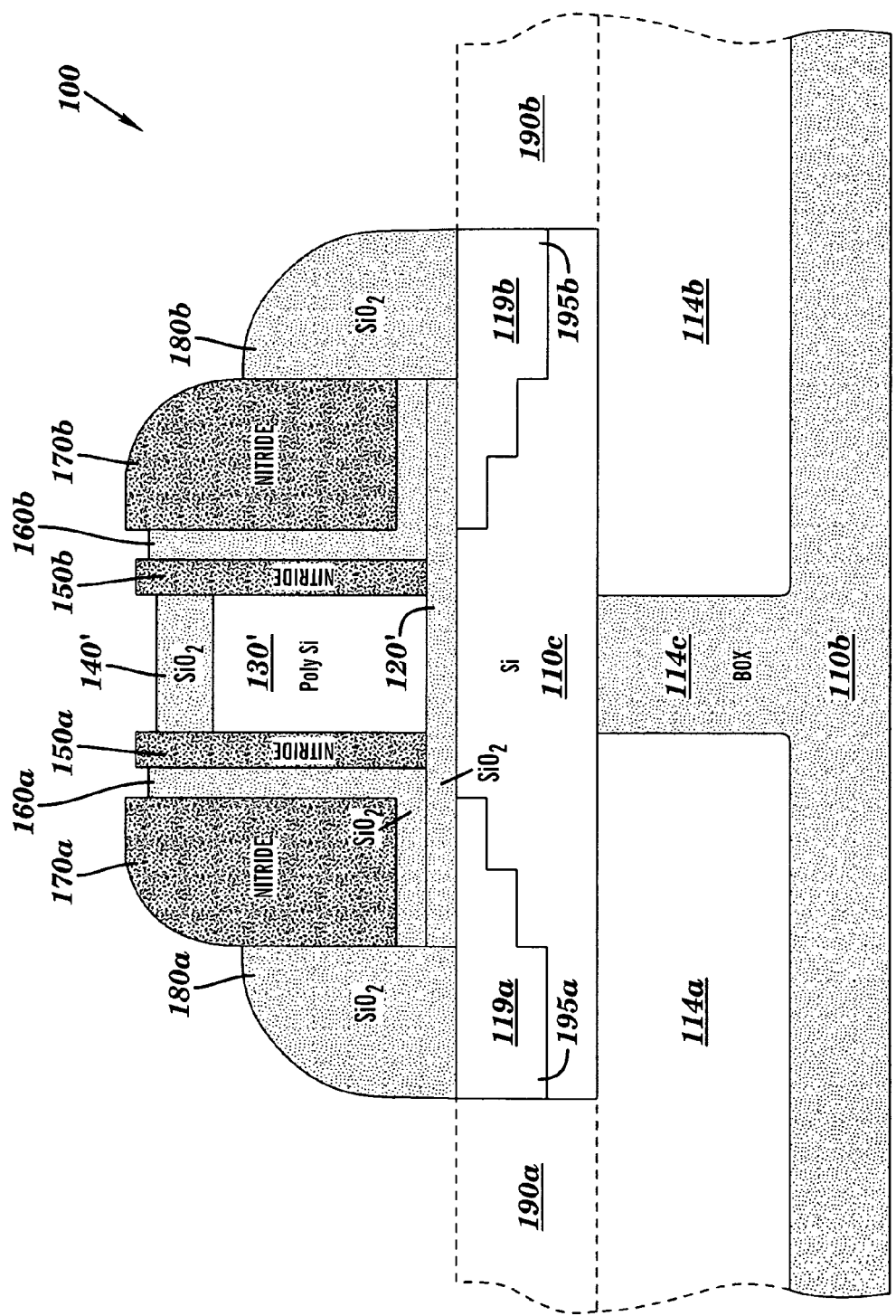

Next, with reference to FIG. 1G, in one embodiment, the method proceeds with an etching step of anisotropically etching away (illustratively, using RIE) silicon regions exposed to the atmosphere while leaving essentially intact other regions comprising other materials such as oxide and nitride. As a result, regions 119a and 119b of the silicon layer 110c are removed.

Next, in one embodiment, the nitrogen-doped regions 114a and 114b can be removed by a wet-etching process which essentially affects only nitrogen-doped oxide material and essentially does not affect other materials such as nitride, silicon, and undoped oxide.

Figure 1H:
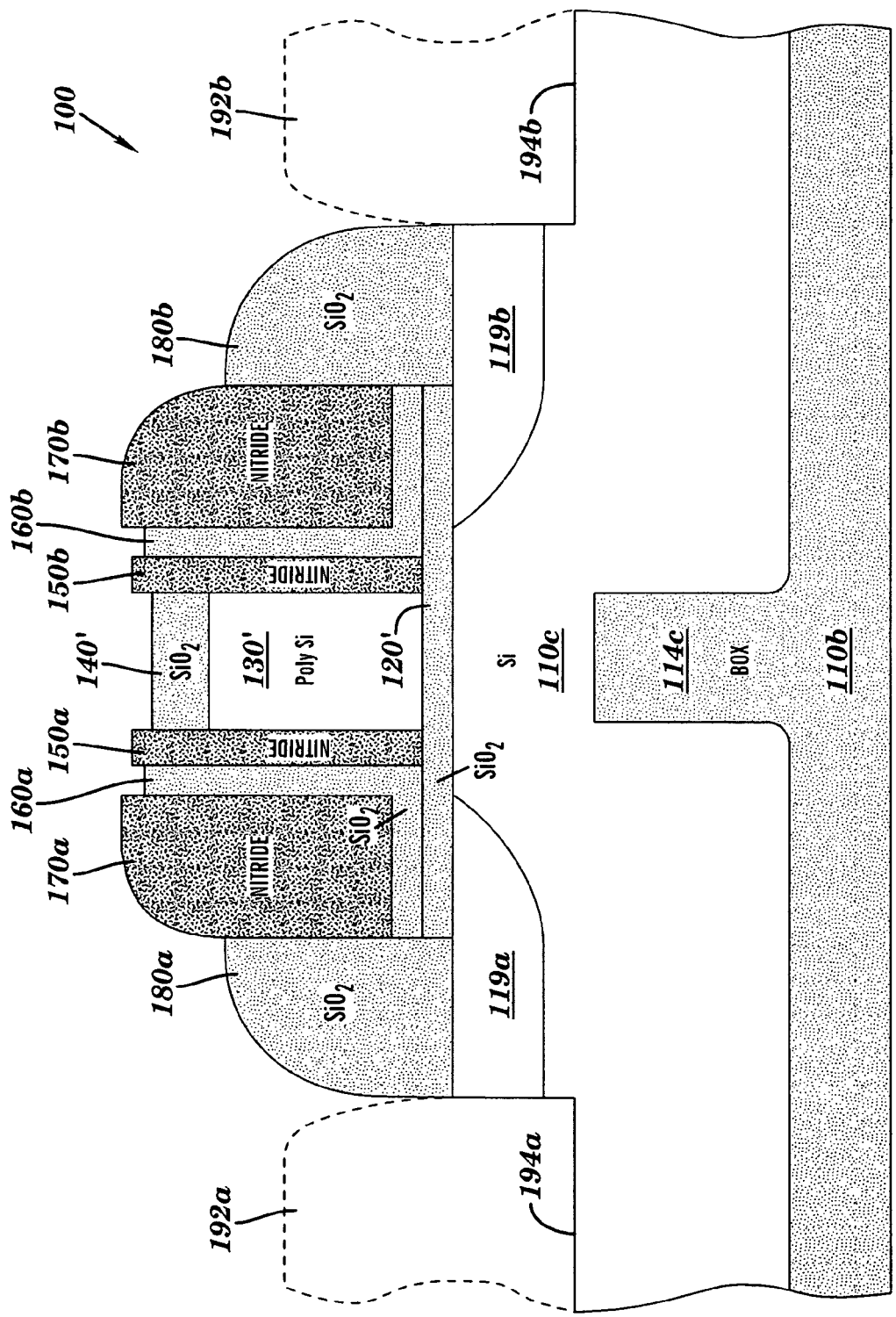

Next, with reference to FIG. 1H, in one embodiment, silicon is epitaxially grown from the silicon layer 110c (including the doped regions 119a and 119b) to top surfaces 192a and 192b.

Next, in one embodiment, the resulting silicon layer 110c is anisotropically etched back (illustratively, using RIE) to top surfaces 194a and 194b, respectively. In one embodiment, the top surfaces 194a and 194b of the resulting silicon layer 110c after etching back are below the bottom surfaces 195a and 195b (FIG. 1G) of the germanium-doped regions 119a and 119b, respectively.

Next, in one embodiment, an anneal process can be performed to diffuse germanium in the germanium-doped regions 119a and 119b into the silicon layer 110c.

Figure 1I:
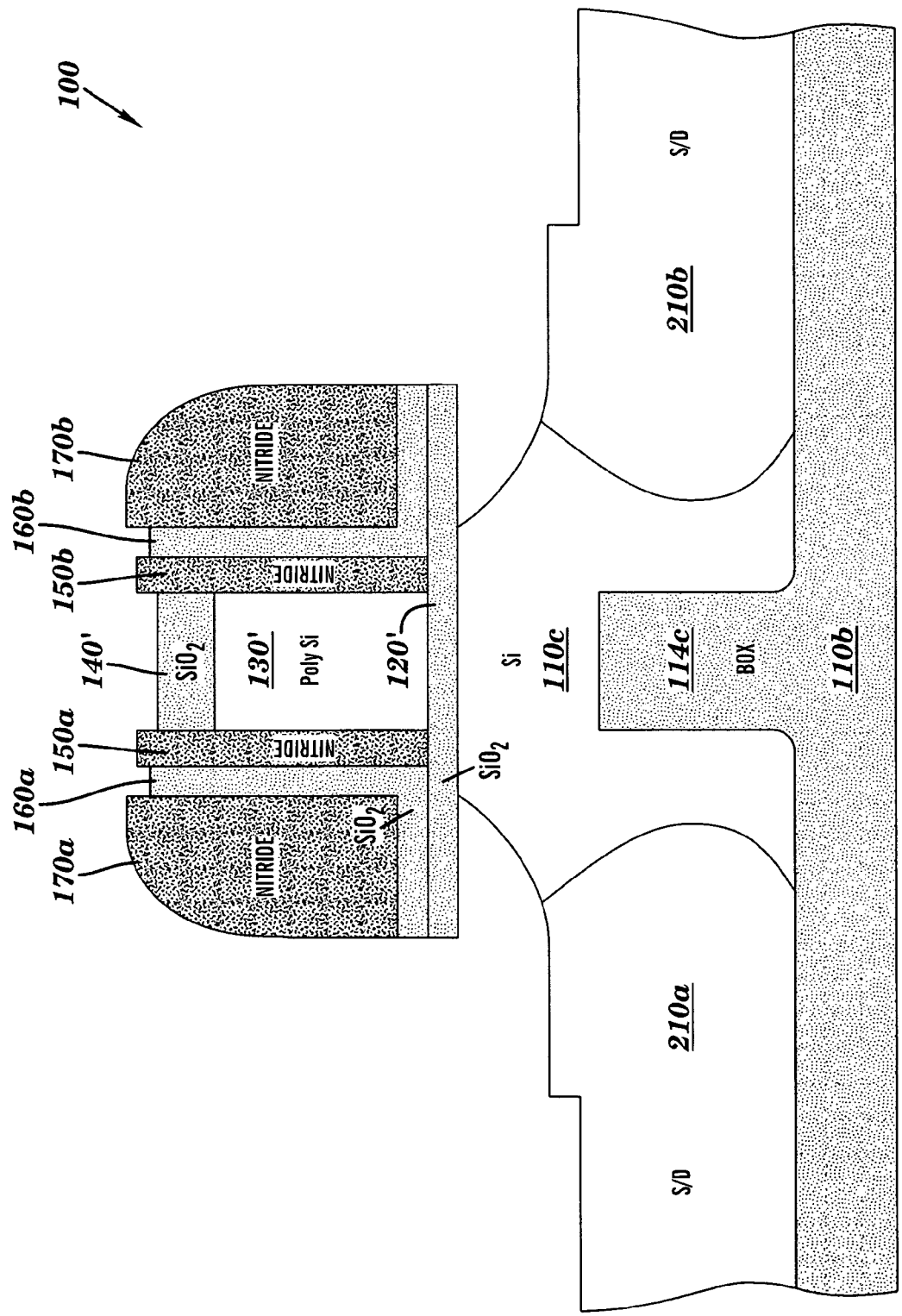

Next, with reference to FIG. 1I, in one embodiment, the germanium-doped regions 119a and 119b (FIG. 1H) of the silicon layer 110c can be removed (illustratively, by wet etching) while leaving essentially intact other regions of the silicon layer 110c that are not doped with germanium.

Next, in one embodiment, an S/D implantation step can be performed to form S/D regions 210a and 210b in the silicon layer 110c. In one embodiment, an S/D anneal step can be performed after the S/D implantation step.

Figure 1J:
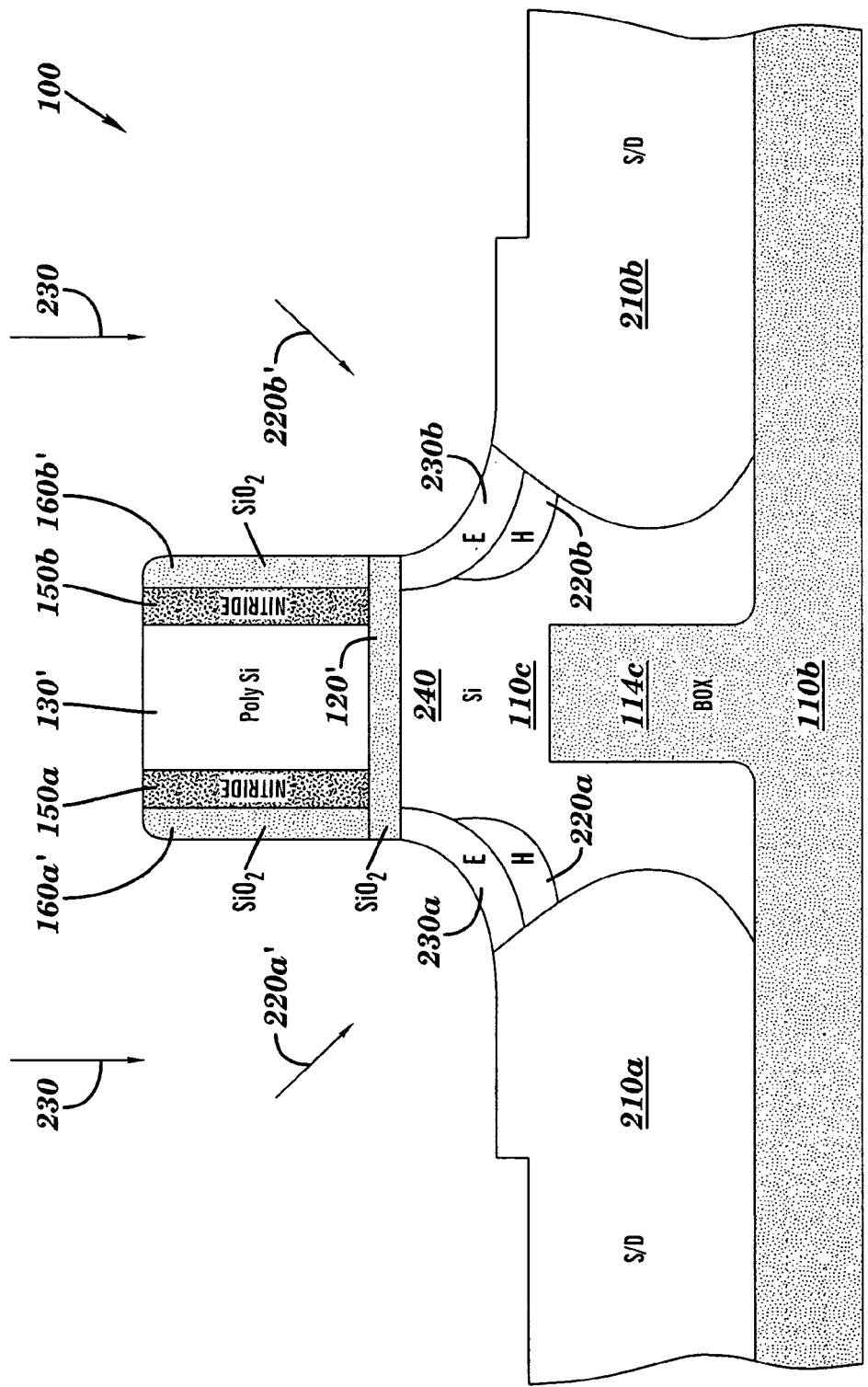

Next, with reference to FIG. 1J, in one embodiment, the method proceeds with a step of anisotropically etching (illustratively, using RIE) the exposed nitride regions 150a, 150b, 170a, and 170b (FIG. 1I). As a result, the nitride spacers 170a and 170b are removed. The nitride regions 150a and 150b are thin and protected by surrounding oxide regions 160a, 160b, and 140' (FIG. 1I). As a result, the etch rate for the nitride regions 150a and 150b is much slower than that for the nitride spacers 170a and 170b. Therefore, when the nitride spacers 170a and 170b are completely removed, the nitride regions 150a and 150b can be almost intact.

Next, in one embodiment, the method proceeds with a step of anisotropically etching (illustratively, using RIE) the exposed oxide regions 160a, 160b, and 140' (FIG. 1I). As a result, the hard mask dielectric region 140' is removed, while the oxide regions 160a and 160b are reduced to the oxide spacers 160a' and 160b', respectively.

Next, in one embodiment, a halo implantation step (represented by an arrow 220a') can be performed to form a halo region 220a. Next, in one embodiment, another halo implantation step (represented by an arrow 220b') can be performed to form a halo region 220b. The arrows 220a' and 220b' also indicate the respective directions of halo ion bombardments.

Next, in one embodiment, an extension implantation step (represented by arrows 230) can be performed to form extension regions 230a and 230b. The arrow 230 also indicates the direction of extension ion bombardments.

Next, in one embodiment, a halo and extension anneal step can be performed to anneal the resulting halo regions 220a and 220b and the resulting extension regions 230a and 230b.

Figure 1K:
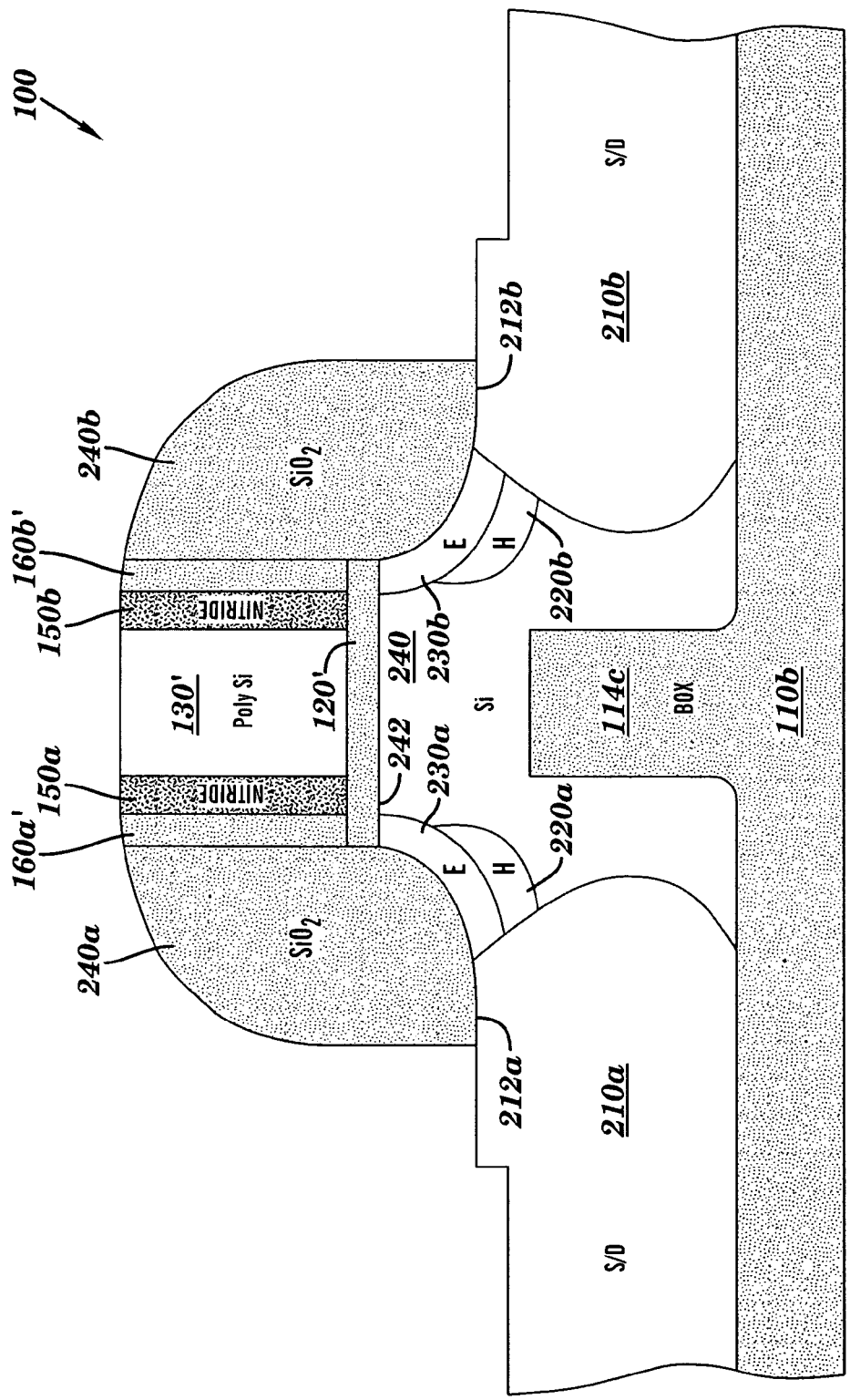

Next, with reference to FIG. 1K, in one embodiment, oxide spacers 240a and 240b are formed on sidewalls of the oxide spacers 160a' and 160b', respectively. In one embodiment, the oxide spacers 240a and 240b can be formed by blanket-depositing an oxide layer (not shown) on top of the structure 100 and then etching back. Now, the gate region 130' and the gate dielectric region 120' can be collectively referred to as the gate stack 120',130' of the structure 100.

In summary, the method for forming lowered S/D transistor 100 starts out with a planar silicon layer 110c (FIG. 1A). Then, the silicon regions 119a and 119b (FIG. 1H) are doped with germanium so that they can be removed later (FIG. 1I) without affecting other silicon regions of the silicon layer 110c. As a result, the transistor 100 (FIG. 1K) has lowered S/D regions 210a and 210b (i.e., top surfaces 212a and 212b of the S/D regions 210a and 210b, respectively, are lower than a top surface 242 of the channel region 240). Considering a path from the gate region 130' to the S/D region 210a through the nitride spacer 150a, the oxide spacers 160a' and 240a, because of the lowered S/D region 210a, the path is extended when it goes through the oxide spacer 240a. As a result, the out-fringing capacitance between the gate region 130' to the S/D region 210a is reduced. For a similar reason, the out-fringing capacitance between the gate region 130' and the S/D region 210b is also reduced.

To form the separating dielectric region 114c (FIG. 1C), the oxide regions 114a and 114b of the underlying dielectric layer 110b are doped with nitrogen so that the oxide regions 114a and 114b can be later removed (FIG. 1G) and replaced by epi-silicon (epi=epitaxially grown) as shown in FIG. 1H. As a result, the separating dielectric region 114c is disposed between the S/D regions 210a and 210b (FIG. 1K). Because of the separating dielectric region 114c, the channel region 240 (immediately beneath the gate dielectric region 120') is thinner. As a result, short channel effects are improved.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for fabricating a semiconductor structure, said method comprising:
   providing a semiconductor layer and a gate stack on the semiconductor layer, wherein the semiconductor layer comprises (i) a channel region directly beneath the gate stack, and (ii) first and second semiconductor regions essentially not covered by the gate stack, and wherein the channel region is disposed between the first and second semiconductor regions;
   removing the first and second semiconductor regions; and
   doping regions directly beneath the removed first and second semiconductor regions so as to form first and second source/drain regions, respectively, such that top surfaces of the first and second source/drain regions are below a top surface of the channel region;
   wherein said removing the first and second semiconductor regions comprises:
      doping the first and second semiconductor regions of the semiconductor layer with first dopants; and
      etching away the first and second semiconductor regions but leaving essentially intact the gate stack and regions of the semiconductor layer which are not doped with the first dopants,
   wherein said doping the first and second semiconductor regions with the first dopants is performed such that each region of the first and second semiconductor regions of the semiconductor layer has a thickness in a first direction perpendicular to a top surface of the channel region that increases discontinuously when moving in a second direction away from the gate stack, and
   wherein the second direction is parallel to the top surface of the channel region.

2. The method of claim 1, wherein the gate stack comprises: (i) a gate dielectric region on the semiconductor layer and (ii) a gate region on the gate dielectric region, and wherein the gate region is electrically isolated from the channel region by the gate dielectric region.

3. The method of claim 1, wherein said doping the first and second semiconductor regions with the first dopants further comprises forming spacers on sidewalls of the gate stack.

4. The method of claim 1, wherein the semiconductor layer comprises silicon, and wherein the first dopants in the first and second semiconductor regions comprise germanium.

5. The method of claim 1, wherein the thickness is a step function of spatial position along the second direction directed away from the gate stack, wherein the step function comprises step shaving a magnitude equal to the thickness, and wherein the magnitude of the steps increase when moving in the second direction away from the gate stack.

6. The method of claim 1, wherein the step function consists of three steps.

7. A method for fabricating a semiconductor structure, said method comprising:
   providing a semiconductor layer and a gate stack on the semiconductor layer, wherein the semiconductor layer comprises (i) a channel region directly beneath the gate stack, and (ii) first and second semiconductor regions essentially not covered by the gate stack, and wherein the channel region is disposed between the first and second semiconductor regions;
   removing the first and second semiconductor regions;
   doping regions directly beneath the removed first and second semiconductor regions so as to form first and second source/drain regions, respectively, such that top surfaces of the first and second source/drain regions are below a top surface of the channel region;
   providing an underlying dielectric layer wherein the semiconductor layer is on the underlying dielectric layer;
   implanting second dopants in a top layer of the underlying dielectric layer except in a separating dielectric region of the top layer directly beneath the gate stack;
   etching away the top layer of the underlying dielectric layer except the separating dielectric region; and
   epitaxially growing a semiconductor material to fill the removed top layer of the underlying dielectric layer before said removing the first and second semiconductor regions is performed.

8. The method of claim 7,
   wherein said implanting second dopants comprises using the gate stack as a mask to implant the second dopants in the top layer of the underlying dielectric layer except in the separating dielectric region, and wherein said etching away the top layer of the underlying dielectric layer is performed such that regions of the underlying dielectric layer which are not doped with the second dopants are essentially intact.

9. The method of claim 8, wherein the second dopants comprise nitrogen, and wherein the underlying dielectric layer comprises silicon dioxide.

10. The method of claim 7, wherein said epitaxially growing the semiconductor material is performed until a top surface of epitaxially grown semiconductor regions is at a level lower than a bottom surface of the first and second semiconductor regions.

11. A method for fabricating a semiconductor structure, said method comprising:
provifding (i) an underlying dielectric layer, (ii) a semiconductor layer on the underlying dielectric layer, and (iii) a gate stack on the semiconductor layer;
implanting first dopants in a top layer of the underlying dielectric layer except in a separating dielectric region of the top layer directly beneath the gate stack;
removing the top layer of the underlying dielectric layer except the separating dielectric region;
epitaxially growing semiconductor regions to fill the removed top layer of the underlying dielectric layer; and
implanting second dopants in semiconductor regions of the semiconductor layer and the epitaxially grown semiconductor regions on opposing sides of the gate stack so as to form first and second source/drain regions such that the separating dielectric region is disposed between the first and second source/drain regions.

12. The method of claim 11, wherein said implanting first dopants comprises using the gate stack as a mask to implant the first dopants in the top layer of the underlying dielectric layer except in the separating dielectric region.

13. The method of claim 11, wherein said removing the top layer of the underlying dielectric layer comprises etching away regions of the underlying dielectric layer doped with the first dopants but leaving essentially intact regions of the underlying dielectric layer not doped with the first dopants;
a wet-etching process that etches away regions of the underlying dielectric layer doped with the first dopants but leaves essentially intact regions of the underlying dielectric layer not doped with the first dopants.

14. The method of claim 13, wherein the method further comprises:
before said etching away is performed, removing regions of the semiconductor layer so as to expose regions of the underlying dielectric layer that are doped with the first dopants.

15. The method of claim 14, wherein said removing the regions of the semiconductor layer comprises:
forming gate spacers on side walls of the gate stack; and
using the gate stack and the gate spacers as a mask to RIE (reactive ion etching) away the regions of the semiconductor layer so as to expose the regions of the underlying dielectric layer that are doped with the first dopants.

16. The method of claim 11, wherein the first dopants comprise nitrogen, and wherein the underlying dielectric layer comprises silicon dioxide.

* * * * *